(12) United States Patent
Isago et al.

(10) Patent No.: US 7,004,181 B2
(45) Date of Patent: Feb. 28, 2006

(54) APPARATUS FOR CLEANING A SUBSTRATE

(75) Inventors: Yoichi Isago, Kanagawa (JP); Kazuo Nojiri, Tokyo (JP); Naoaki Kobayashi, Chiba (JP); Teruo Saito, Chiba (JP); Shu Nakajima, Kanagawa-ken (JP)

(73) Assignee: Lam Research Corporation, Fremont, CA (US)

( * ) Notice: Subject to any disclaimer, the term of this patent is extended or adjusted under 35 U.S.C. 154(b) by 238 days.

(21) Appl. No.: 10/229,931

(22) Filed: Aug. 27, 2002

(65) Prior Publication Data
US 2003/0041881 A1    Mar. 6, 2003

(30) Foreign Application Priority Data
Aug. 31, 2001    (JP)    .............................. 2001-264627

(51) Int. Cl.
*B08B 3/02*    (2006.01)

(52) U.S. Cl. .................. 134/102.1; 134/95.1; 134/95.3; 134/902

(58) Field of Classification Search ............. 134/102.1, 134/102.2, 95.1, 95.3, 902
See application file for complete search history.

(56) References Cited

U.S. PATENT DOCUMENTS

| | | | | |
|---|---|---|---|---|
| 1,504,851 | A | * | 8/1924 | Wren ....................... 239/417.5 |
| 4,255,121 | A | * | 3/1981 | Sugimoto .................... 431/208 |
| 5,462,229 | A | * | 10/1995 | Tanaka et al. ........... 239/397.5 |
| 5,520,331 | A | * | 5/1996 | Wolfe ............................. 239/8 |
| 5,799,878 | A | * | 9/1998 | Gorde et al. ............. 239/419.3 |
| 5,873,380 | A | * | 2/1999 | Kanno ...................... 134/102.1 |
| 5,887,605 | A | * | 3/1999 | Lee et al. ................. 134/102.2 |
| 6,299,696 | B1 | * | 10/2001 | Kamikawa et al. ............. 134/2 |
| 6,589,359 | B1 | * | 7/2003 | Kamikawa et al. ........... 134/26 |
| 6,598,805 | B1 | * | 7/2003 | Sakai et al. .................. 239/128 |
| 6,610,168 | B1 | * | 8/2003 | Miki et al. ................... 156/344 |

\* cited by examiner

*Primary Examiner*—Michael Barr
*Assistant Examiner*—Saeed T. Chaudhry
(74) *Attorney, Agent, or Firm*—IP Strategy Group, PC

(57) ABSTRACT

The invention provides a water supplying apparatus and method thereof which has a high capacity of peeling and removing a disused material such as a resist film and the like, and can efficiently use water vapor. A water supplying apparatus for executing a washing process, a cleaning process and a working process of a subject, is provided with a water vapor body supplying means for supplying a water vapor body, and a water mist body supplying means for supplying a water mist body containing liquid water fine particles, and the structure is made such that said water vapor body and said water mist body are supplied to the subject by independently controlling said two means.

18 Claims, 7 Drawing Sheets

(a)

(b)

(c)

APPARATUS FOR CLEANING A SUBSTRATE

REFERENCE TO RELATED APPLICATION

This application claims the priority right of Japanese Patent Application No. 2001-264627 filed on Aug. 31, 2001, the entire disclosure of which is incorporated herein by reference.

BACKGROUND OF THE INVENTION

1. Field of the Invention

The present invention relates to an apparatus for supplying water ($H_2O$) in a manufacturing process of a product, and relates to an apparatus for supplying high purity water used for a working process of a product surface and a washing and cleaning process thereof. More particularly, the present invention relates to a water supplying apparatus and a method thereof for peeling out a disused material such as a resist film, a polymer residue or the like attached to a subject surface such as a semiconductor wafer, a hard disc (HD), a liquid crystal display (LCD), a flat panel display (FPD) or the like in a lithography process so as to remove.

2. Description of the Related Art

In the manufacturing process of a semiconductor device, a liquid crystal display, a magnetic disc, a printed circuit board or the like, a resist is applied to a surface of the substrate and a high-precision process such as pattern forming or the like is applied to the surface of the substrate through lithography. Thereafter, a process of removing the disused material such as the resist film, the polymer residue or the like attached to the surface of the substrate is executed.

As a techniques of removing the disused material such as the resist film or the like which has been conventionally executed by several methods including, ashing methods of removing the resist film by generating oxygen plasmas, thermally removing a film by an organic solvent (a phenol solvent, a halogen solvent or the like), and thermally dissolving films by exposure to concentrated sulfuric acid and hydrogen peroxide.

However, in any of the methods mentioned above, a time, an energy and a chemical material for disassembling and dissolving the resist film and the like are required, and a load in the process of disassembling and dissolving the resist film and the like is great. The plasma asher method is generally well known, however, there is a problem that a charge-up damage generated by charged particles is great. Further, since it is impossible to sufficiently remove a reaction product (a polymer residue) generated in an etching process, it is necessary to submit the workpiece to wet clean treatments, thereby increasing the number of processes. In the field of precision surface treatment techniques for removing disused material such as resist film, great attention has been paid to the use of water and water vapor. Use of water is advantageous over the prior art's use of chemical material and chemical processes in its impact on the environment.

Japanese Unexamined Patent Publication No. 2001-118817 describes a technique of removing the resist film remaining on the surface of a semiconductor apparatus, a liquid crystal device or the like by using the water vapor. Japanese publication no. 2001-118817 discloses a technique of lifting and removal of the residual resist film from the surface of the substrate using high temperature mist.

However, in order to completely peel out and remove the resist film, it is necessary to generate a significant amount of water vapor which requires burdensome electric power consumption.

As discussed, prior attempts to utilize water vapor for photoresist removal have proved inefficient. Therefore a need exists for a more controlled, efficient methods of photoresist and post etch cleaning.

SUMMARY OF THE INVENTION

Broadly speaking, the present invention is an apparatus that provides for cleaning a substrate. It should be appreciated that the present invention can be implemented in numerous ways, including as an apparatus, a system, a device, or a method. Several inventive embodiments of the present invention are described below.

In accordance with one embodiment of the present invention, a cleaning apparatus comprising an aperture capable of supplying a water vapor and an aperture capable of supplying a mist containing water particles is provided. The aperture capable of supplying the water vapor and the aperture capable of supplying the mist are applied through a nozzle to a substrate having one of a resist film and a polymer residue.

In accordance with another embodiment of the present invention, a cleaning apparatus having a nozzle comprising having a first passage for a first and a second passage for a second fluid that provides mixing of the first fluid and the second fluid is provided.

In accordance with another embodiment of the present invention, a method for cleaning a substrate is provided. The method includes mixing water vapor and gas, distributing the mixture of water vapor and gas on the surface of a substrate having a disused material, permeating the disused material, injecting a mist containing water particles onto the surface of a substrate; and removing the disused material.

The advantages of the present invention are numerous. The substrate cleaning apparatus' use of water vapor and water mist provides efficient removal of resist films and polymer residues. Several embodiments of the apparatus being capable of independent control over the delivery of fluids to the substrate provides for removal of disused materials in semiconductor manufacturing processes. Prior combination of fluids within a nozzle during the delivery of fluid to the surface of the substrate assists in removal properties of undesirable materials on the substrate.

It is to be understood that the foregoing general description and the following detailed description are exemplary and explanatory only and are not restrictive of the invention, as claimed.

DESCRIPTION OF THE PREFERRED EMBODIMENTS

The following is a description of several embodiments of a water supplying apparatus and a water supplying method for cleaning semiconductor substrates in accordance with the present invention.

Figure 7:
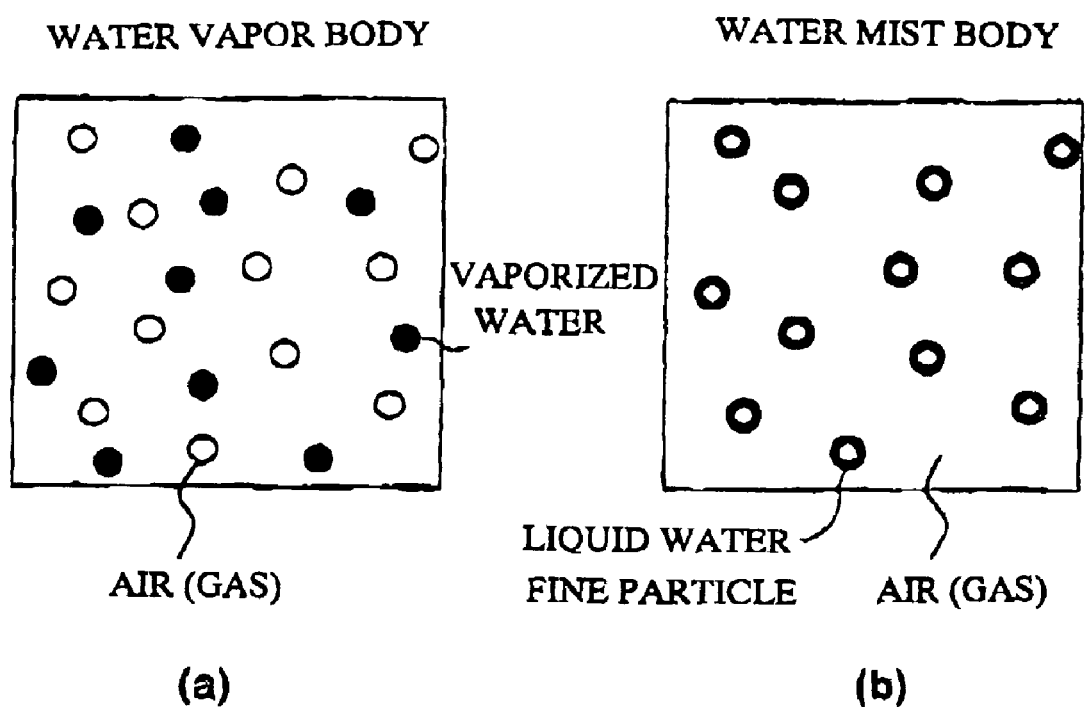
FIG. 7 is a pattern schematic view of a water vapor body and a water mist body.

FIG. 7 is a view showing a pattern structure of a water vapor and a water mist which are used in the present invention. The water vapor in this case generally exists in a state such that heated and vaporized water (vaporized water (H2O molecule) is present in a gas such as air or the like as shown in FIG. 7(a). It is also possible that 100% water vapor is used that contains no gas. Further, the water mist exists in a state such that liquid-like water fine particles are contained in the gas, as shown in FIG. 7(b).

It is possible to generate water vapor by dropping liquid water on a heated plate. Wafer vapor may also be generated by applying heat through any number of suitable techniques such as through the use of electric heaters, gas, or thermal lights. The temperature of the water vapor is controlled so as to be equal to or more than 100° Celsius (C) under the atmospheric pressure, preferably between 130° C. and 160° C.

The water mist can be generated, for example, by vigorously injecting water at room temperature with gas from a nozzle, or by injecting the gas into the water.

It is preferable to set a temperature of the water mist to be equal or less than 100° C. under the atmospheric pressure in order to avoid inefficiencies associated with heating and controlling the temperature of the water.

Applying water vapor and the water mist to a substrate within a process chamber, it is possible to control an inner portion of the chamber in the atmospheric pressure state, a depressurized state and a pressurized state, and in this case, the temperatures of the water vapor body and the water mist can be changed by the pressure within the chamber. Accordingly, the temperature of the water vapor can be controlled so as to be equal to or more than a boiling point thereof, and the temperature of the water mist can be controlled so as to be equal to or less than a boiling point thereof. The vaporized water is normally contained in air, however, it is not limited to air, and a gas such as nitrogen, argon, helium and the like may be employed. Nitrogen, Argon, Helium and other suitable gasses can be applied to the water mist in a similar fashion.

Methods of producing the water mist body that includes the use of liquid water fine particles containing ozone, carbon dioxide, ion, acid or an alkaline material include:

(1) Generating mist from liquid water previously containing ozone, carbon dioxide, ion, acid or an alkaline material.

(2) Injecting gas into water containing ozone, carbon dioxide, ion, acid or an alkaline material. Addition of gas to the water containing ozone, carbon dioxide, ion, acid or an alkaline material in a nozzle creates a water mist body.

(3) Adding ozone, carbon dioxide, ion, acid or an alkaline material after making the water mist.

Further, by using the water mist body mentioned above, it is possible to prevent and remove electric charging of the substrate during removal of a disused material such as the resist or the like.

Figure 1:
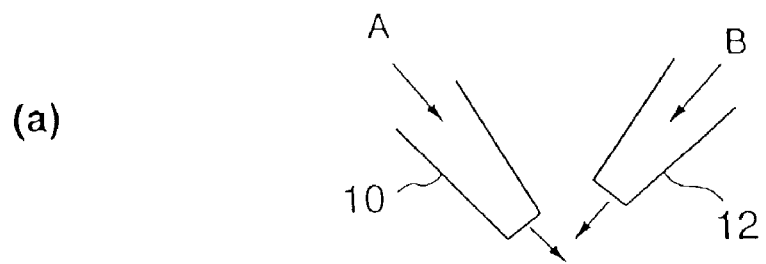
FIG. 1 is a schematic view showing an embodiment of a nozzle means employed in a water supplying apparatus in accordance with the present invention.
Figure 1:
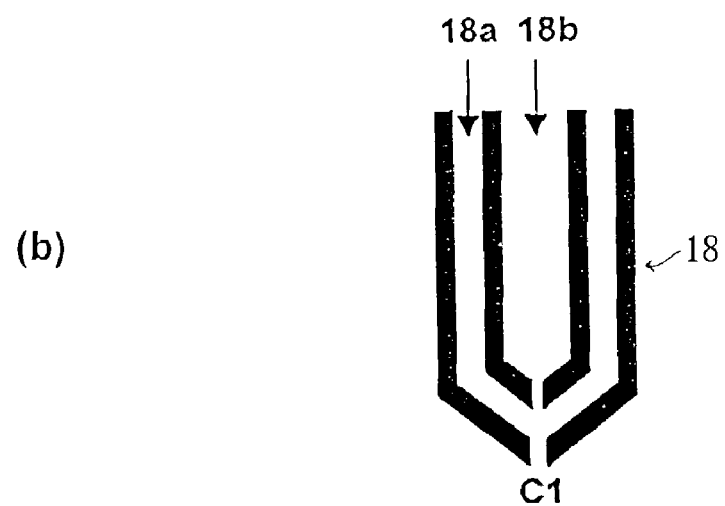
Figure 1:
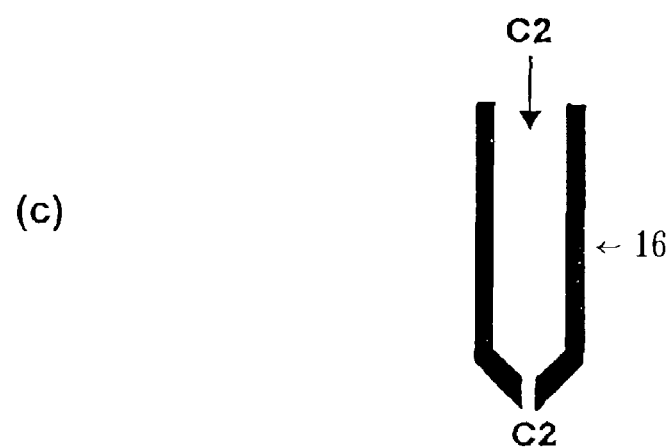

FIG. 1(a) shows an embodiment of a structure of a nozzle used in a water supplying apparatus in accordance with the present invention. In this embodiment, two nozzles 10 and 12 are independently prepared. Further, a supplied material A is a water vapor body supplied to the nozzle 10 and a supplied material B is a water mist body supplied to the nozzle 12. In this case, the nozzle 10 and the nozzle 12 are arranged close to a substrate (not shown).

The water vapor body injected from the nozzle 10 reaches a surface of the substrate and permeates the disused material, such as the resist film, so as to weaken the bonding force between the disused material and the substrate.

Further, the water mist injected from the nozzle 12 to the surface of the substrate is applied at a predetermined pressure so as to peel and remove the disused material having a weakened bonding force to at the surface of the substrate.

A high peeling effect can be obtained when the temperature of the water vapor body is over 100° C. and preferably between about 120° C. and about 180° C. and the temperature of the water mist body is equal to or less than 100° C.

In the manner mentioned above, in accordance with the water supplying apparatus of the present invention, the apparatus is structured such as to properly and effectively supply the water vapor body and the water mist body to the subject by providing a means for supplying the water vapor body in one nozzle and providing a means for supplying the water mist body in another nozzle, and combining these two means so as to independently control them.

In this case, in FIG. 1(a), the description is given on the assumption that the supplied material A is the water vapor body supplied to the nozzle 10, and the supplied material B is the water mist body supplied to the nozzle 12, however, the supplied material A may be of course the water mist body supplied to the nozzle 10, and the supplied material B is the water vapor body supplied to the nozzle 12.

FIGS. 1(b) and 1(c) show another embodiment of the structure of the nozzle means used in the water supplying apparatus in accordance with the present invention. A nozzle 18 in FIG. 1(b) or a nozzle 16 in FIG. 1(c) corresponds to any one of two nozzles 10 and 12 in FIG. 1(a).

FIG. 1(c) shows a state that a water mist body c2 itself produced in the other place for supplying the water mist body c2 is supplied through the nozzle 16.

FIG. 1(b) shows a nozzle having a structure such that an inner portion of the nozzle 18 is separated into a center supplying portion 18B and an outer supplying portion 18A. A water mist body c1 is produced within the nozzle 18. In one example water mist is produced within the nozzle by using by mixing the liquid water and the gas. Accordingly, the nozzle 18, may supply different materials to the center supplying portion 18B and the outer supplying portion 18A in a branched manner, whereby the materials are mixed near the injection port producing the water mist body c1.

Figure 2:
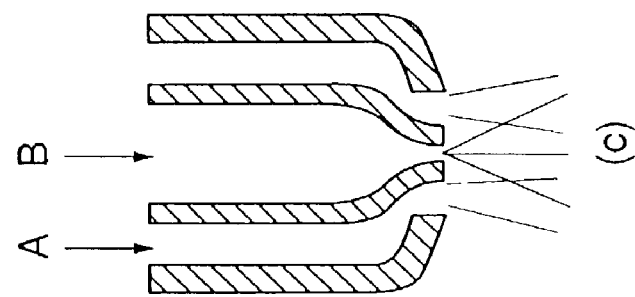
FIG. 2 is a cross sectional schematic view of a two-fluid mixture injecting nozzle apparatus corresponding to an embodiment of a nozzle apparatus employed in the water supplying apparatus in accordance with the present invention.
Figure 2:
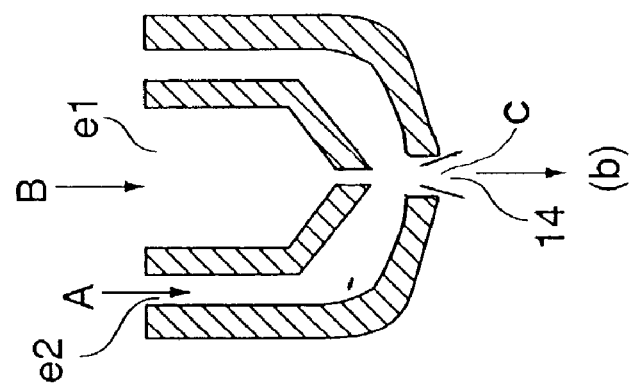
Figure 2:
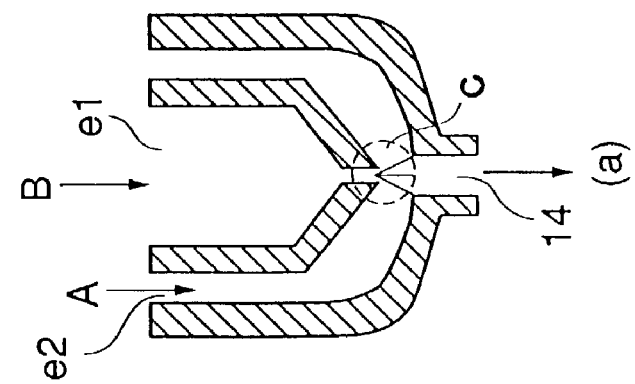

FIG. 2 is a cross sectional view showing an embodiment of the nozzle apparatus used in the water supplying apparatus in accordance with one embodiment the present invention.

In a nozzle apparatus shown in FIG. 2(a), liquid water in a high-pressure state is supplied as the supplied material B from a center supply port e1. Further, the water vapor is supplied as the supplied material A from a side supply port e2. Further, in a portion (a portion shown by a dotted circle in the drawing) near a discharge port of the nozzle apparatus, the water vapor body A and the liquid water B are mixed, and a water mist body C is formed and injected from an injection port.

In the nozzle apparatus shown in FIG. 2(a), one nozzle apparatus is provided, however, is provided with two means constituted by a means for supplying the water vapor body and a means for supplying the water mist body. In this case, the water mist body C in this nozzle apparatus is not supplied from the other place after previously produced, but the water mist body C is produced on the basis of the discharge of the liquid water B. Accordingly, in this case, by controlling the supply of the water vapor body A and the liquid water B, it is possible to independently control the means for supplying the water vapor body and the means for supplying the water mist body, and two means can be variously combined.

In the nozzle apparatus shown in FIG. 2(b), the water vapor is supplied as the supplied material B from the center supply port e1. Further, the liquid water is supplied as the supplied material A from the side supply port e2. Further, in a portion (a portion shown by reference 14 in the drawing) near the discharge port of the nozzle apparatus, the water vapor body B and the liquid water A are mixed, whereby the water mist body C is produced and is injected out from the injection port 14.

In FIGS. 2(b) and 2(a), both of the structures are made such that the water vapor body and the liquid water are respectively supplied from different supply ports (e1, e2), however, the apparatuses themselves have no great difference.

Accordingly, in FIG. 2(b), by controlling the supply of the water vapor body A and the liquid water B, it is possible to independently control two means constituted by the means for supplying the water vapor body and the means for supplying the water mist body, and two means can be variously combined.

FIG. 2(c) shows a nozzle structure. In this nozzle structure, the water vapor and the liquid water are not mixed as is different from FIGS. 2(a) and 2(b), and accordingly, the mixing portion is not provided. In this case, the structure is made such that the water vapor and the water mist are respectively discharged so as to be injected on the substrate. Material A and material B comprising water vapor body and the water mist body are applied as the supplied material through the nozzle apparatus.

The nozzle apparatuses exemplified in FIGS. 2(a), 2(b) and 2(c) are called as two-fluid mixture injection nozzles, however, a shape of the two-fluid mixture injection nozzle capable of being used in the present invention is not limited to this, and can be variously modified. In any case, the structure can be employed as far as it is possible to independently control the amount of supply, the temperature, the injection pressure of the water vapor body and the water mist body.

Then, there is shown here one embodiment among the researches and experiments executed by the inventors.

A state that the water mist body (the fine particles) and the water vapor body (the water vapor gas body) exist together is prepared by heating pure water of 400 cc/minute by using a pure water heating apparatus having a processing capacity of 400 cc/minute, and a desirable result of removing a resist film can be obtained at a time of injecting the water mist body and the water vapor body to the semiconductor wafer to which the resist film is attached, via the nozzle apparatus. A weight ratio between the water vapor body and the water mist body at this time is 25:75.

Figure 3:
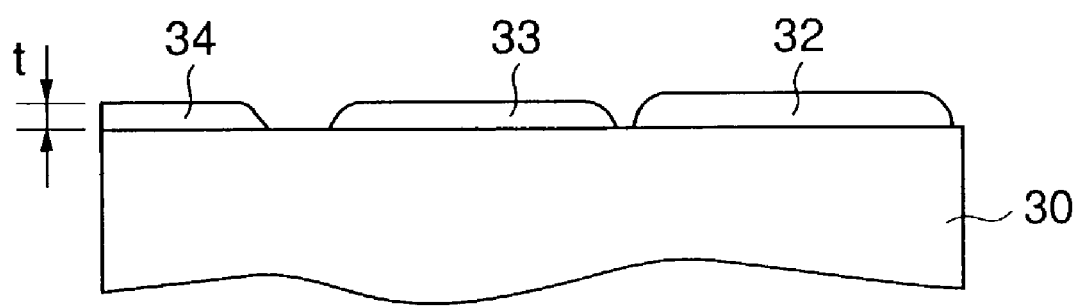
FIG. 3 is a cross sectional view of a wafer to which a resist film is attached, showing an embodiment of a subject to which a water vapor body and a water mist body are supplied in connection with the present invention.

FIG. 3 shows a substrate to which the water vapor body and the water mist body have been supplied in accordance with the present invention. A cross sectional view of the wafer illustrates the resist film attached. The resist films 32, 33 and 34 are closely adhered the wafer 30 so as to form hard film layers, having a thickness of about 500 nm to about 800 nm.

FIG. 3 illustrates one example of the substrate requiring resist film removal after ion implantation. Removal of the films can be effectively executed by using the water supplying apparatus in accordance with the present invention.

The removal of films is not limited to photoresist, and other materials such as polymer residue are listed as examples. Polymer residue is generated as a reaction by-product at the time of etching. Polymer residue can be removed using the water supplying apparatus in accordance with the present invention.

Both resist film removal and polymer residue removal can be executed at the same time using the water supplying apparatus in accordance with the present invention. Alternatively, each can separately executed.

In accordance with the present invention, a method for supplying the water vapor (in most cases, including the water vaporized in the gas) and a method for supplying the water mist including the fine water particles. The aforementioned methods are capable of independently control. Water vapor and water mist can be directly supplied to the substrate.

Accordingly, at a time of executing the process of removing the disused material such as the resist film or the like, it is possible to consider separating the process of supplying the water vapor body to the wafer and the process of supplying the water mist body to the wafer. At this time, it can be assumed that the water gas body is effective for changing its nature of the resist film or the like due to the permeation of the gas body, and the water mist body is effective for peeling the resist film or the like by the fine particles of the water.

For example, the resist film is formed in manufacturing the semiconductor device on a base polymer structure having a hole property and a hydrogen bonding property. The resist film body generates physical changes such as softening and expansion by the high-temperature water vapor. Further, resist permeability of the water vapor generates physical changes such as swelling, separation and solidification generating a change in chemical structure. Accordingly, the resist film hydrated and swelled by the high temperature water vapor softens and the bonding force with the wafer and is weakened thereby advancing peeling. Further, an injection force otherwise known as a spraying force of the nozzle apparatus applied at a time of supplying the water vapor or the water mist to the substrate to largely effectuates peeling of the swelled resist from the substrate.

The water mist comes into collision with the particles attached on the surface at an injecting speed from the nozzle. In one example, a magnitude of the water mist is set so that a diameter thereof is about 5 to 50 nm and an injecting speed of about 40 m/second, a colliding force thereof is sufficient to peel the particles of 0.1 to a few $\mu$m from the substrate.

Figure 4:
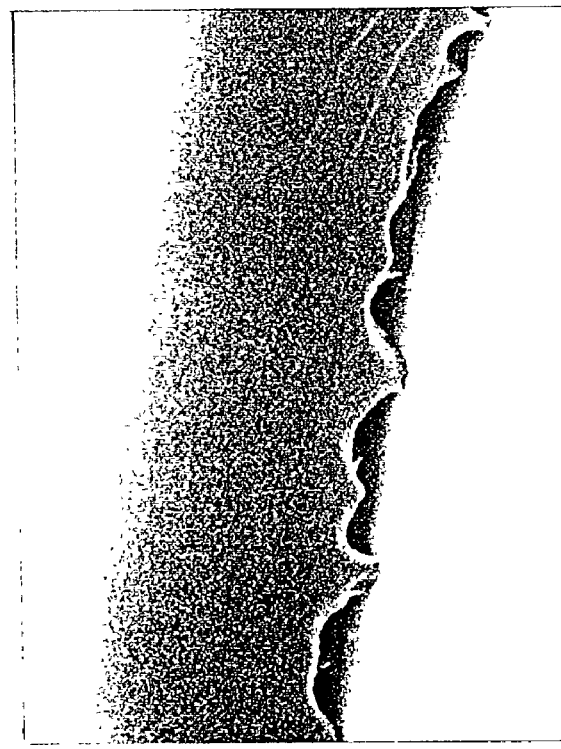
FIG. 4 is an enlarged photograph obtained by photographing a state that the resist film attached to the wafer changes its nature due to a process applied by the apparatus in accordance with the present invention, by using an electron microscope.
Figure 4:
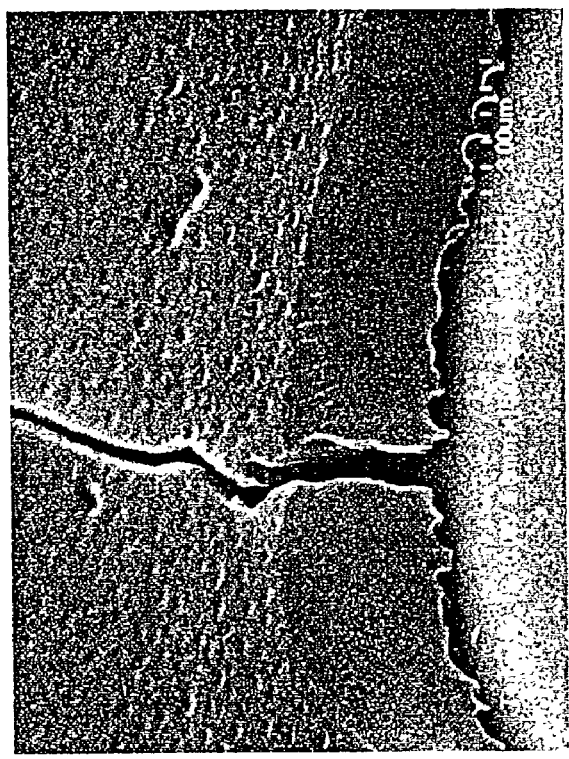

FIG. 4 is an enlarged photograph obtained by photographing a state that the resist film attached to the wafer changes its nature at a time of executing the process by using the water supplying apparatus in accordance with the present invention, by using an electron microscope. As shown in a photograph (a), when the water vapor body is permeated, changes such as softening and expansion of the resist film are promoted generating a deformation and a gap the wafer and the resist film, weakening the bonding force. Next, as shown in a photograph (b), due to a further permeation of the water vapor, physical changes such as swelling, separation, and solidification in the resist film body generate a crack or breech, resulting in the peeling of the resist film from the wafer in cooperation with an operation of the water mist.

Figure 5:
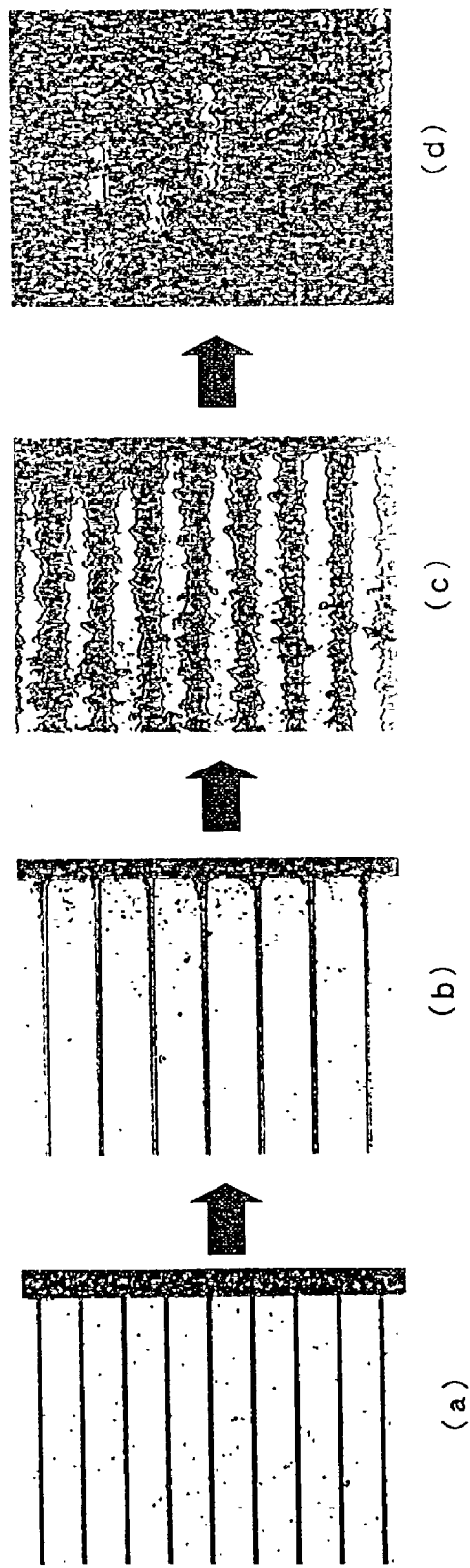
FIG. 5 is a photograph showing a state that the resist film attached to the wafer is peeled out so as to gradually pass out of existence.

FIG. 5 is a illustrates the state of the resist film (pale color portions) attached to the wafer (deep color portions) gradually reduced in an order of(a)→(b)→(c)→(d) while removing the resist film by using the water supplying apparatus in accordance with the present invention.

FIG. 5 provides an illustration of one embodiment of the present invention, however, in this case, the process of removing the resist film is executed while the water vapor having a temperature of 120° C. is applied to a substrate placed on a table rotating at 4 rpm. The nozzle applying the water vapor is 20 mm from the substrate, and provides pure water at a flow rate 100 cc.

Figure 6:
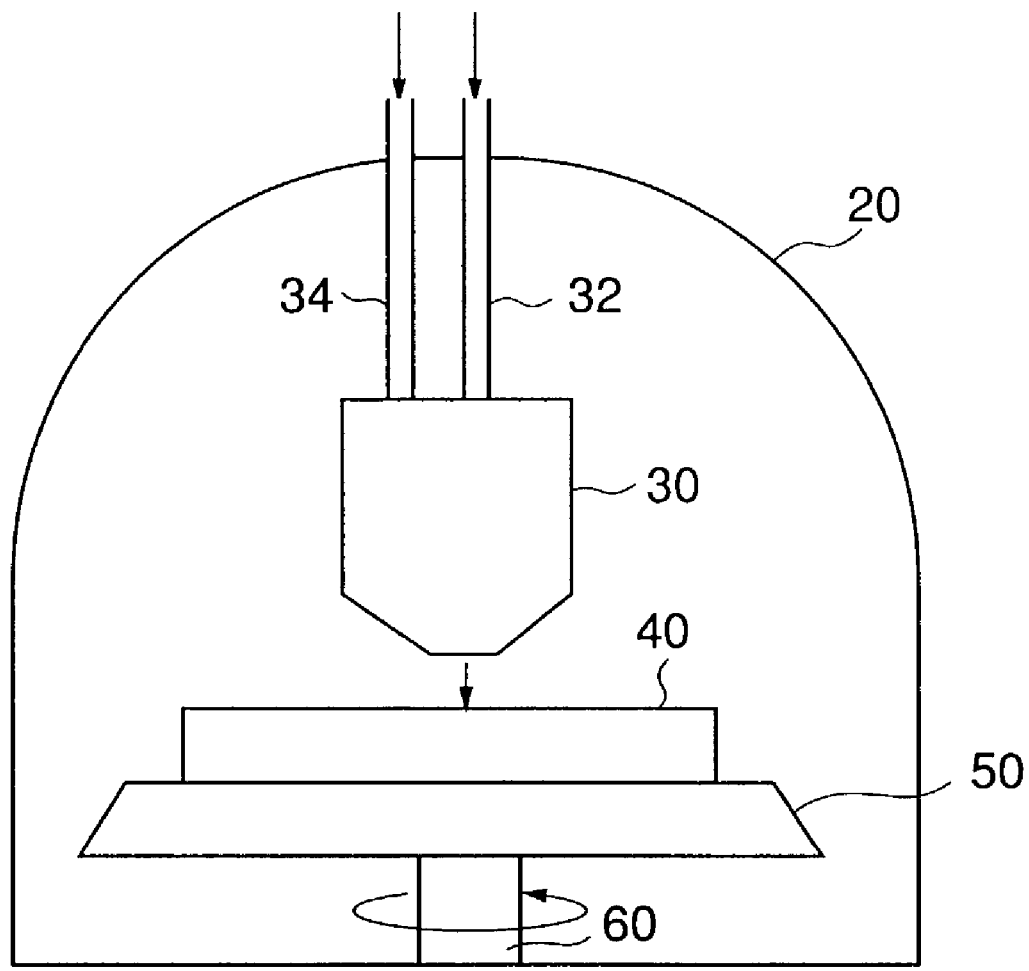
FIG. 6 is a view showing a schematic structure of a water supplying apparatus in accordance with the present invention.

FIG. 6 is a schematic of the water supplying apparatus in accordance with the present invention. A substrate 40 is placed on a rotating table 50 which rotates about shaft 60 within a processing chamber 20. A nozzle 30 is arranged at a predetermined interval apart from the substrate 40 so as to be opposed to the substrate 40, and a flow passage 32 for supplying the water vapor and a flow passage 34 for supplying the water mist are attached to the nozzle 30.

At a time of removing the disused material such as the resist or the like, the water vapor body and the water mist body are injected from a front end of the nozzle 30 by scanning the nozzle means 30 in a radial direction of the subject substrate 40 while rotating the substrate 40 at a predetermined speed so as to execute a peel-out and a removal.

The above description and embodiments is not limited to removing resist films and polymer residues generated in manufacturing of semiconductor electronic devices. Independently control the supply conditions of the water vapor and water mist, enhance the peeling and removing of the disused materials such as the resist films polymer residues. The water supplying apparatus a Working process in the manufacture of other electronic devices and the surface treatments may be advanced by the present invention. The water supplying apparatus is effective in cleaning a substrate after chemical mechanical polishing (CMP) or etching, and, may also be used for cleaning a fine circuit, a mask for forming a fine circuit, and other suitable operations.

What is claimed is:

1. A cleaning apparatus configured for cleaning a substrate having one of a resist film and a polymer residue on a surface of the substrate, comprising:
   a water vapor producing arrangement including a heating arrangement for heating water to produce water vapor and an aperture configured to supply the water vapor at a first temperature to the surface of the substrate; and
   a water mist producing arrangement including an aperture configured to supply a water mist containing water particles to the surface of the substrate, the water mist being supplied to the surface substrate at a second temperature lower than the first temperature, wherein said water vapor producing arrangement is different from said water mist producing arrangement.

2. The cleaning apparatus as claimed in claim 1, wherein at least one of said water vapor and said water mist containing said water particles is accompanied by a gas.

3. The cleaning apparatus as claimed in claim 1, wherein the water vapor producing arrangement is configured to produce the water vapor suitable for permeating the one of the resist film and the polymer residue, and the water mist producing arrangement is configured to produce the water mist suitable for physically peeling the one of the resist film and the polymer residue.

4. The cleaning apparatus as claimed in claim 1, wherein the heating arrangement is configured to produce the water vapor at the first temperature that is at least equal to a boiling point of said water, and wherein the water mist producing arrangement is configured to produce the water mist at the second temperature that is at most equal to the boiling point of the water.

5. A cleaning apparatus configured for cleaning a substrate having one of a resist film and a polymer residue on a surface of the substrate, comprising:
   a water vapor producing arrangement configured to supply water vapor to said surface of said substrate through a first nozzle, said water vapor being produced using water at a first water usage rate;
   a water mist producing arrangement configured to supply water mist to said surface of said substrate through a second nozzle different from said first nozzle, said water mist being producing using said water at a second water usage rate higher than said first water usage rate, thereby enabling said water mist to exert a greater peeling force on said surface of said substrate than a peeling force exerted by said water vapor.

6. The cleaning apparatus as claimed in claim 5 wherein the water vapor producing arrangement further includes a heating arrangement configured to furnish the water vapor at a first temperature that is higher than a second temperature associated with the water mist, thereby enabling said water vapor to permeate said one of said resist film and said polymer residue on said surface of said substrate to a greater extent than said water mist.

7. The cleaning apparatus as claimed in claim 5, wherein said water vapor producing arrangement is further configured to mix a gas with said water vapor prior to subjecting said surface of said substrate to said water vapor, said gas being one of air, nitrogen, carbon dioxide, ozone, argon, and helium.

8. The cleaning apparatus as claimed in claim 5, wherein said water vapor producing arrangement is configured to introduce said water vapor to said surface of said substrate simultaneously with an introduction by said water mist producing arrangement of said water mist to said surface of said substrate.

9. The cleaning apparatus as claimed in claim 5, wherein said water vapor producing arrangement is configured to introduce said water vapor to said surface of said substrate at a time that is different from a time that said water mist producing arrangement introduces said water mist to said surface of said substrate.

10. The cleaning apparatus as claimed in claim 5, wherein said water mist producing arrangement is configured to introduce said water mist to said surface of said substrate after said water vapor is provided to said surface of said substrate.

11. The cleaning apparatus as claimed in claim 5, wherein said substrate is disposed in a processing chamber, the processing chamber having a pressure controlled inner portion capable of maintaining one of an atmospheric pressure state, a depressurized state, and a pressurized state.

12. The cleaning apparatus as claimed in claim 5, wherein said water vapor producing arrangement further includes a heating arrangement that is configured to produce the water vapor at a first temperature that is at least equal to a boiling point of said water, and wherein the water mist producing arrangement is configured to produce the water mist at a second temperature that is at most equal to the boiling point of the water.

13. A cleaning apparatus configured for cleaning a substrate having one of a resist film and a polymer residue on a surface of the substrate, comprising:

water vapor producing means including heating means for heating water to produce water vapor at a first temperature, and means for directing the water vapor at the one of the resist film and the polymer residue; and water mist producing arrangement including means for generating a water mist at a second temperature, and means for directing the water mist to the one of the resist film and the polymer residue, the water mist containing water particles, the second temperature being lower than the first temperature, said means for directing said water mist being different from said means for directing said water vapor.

14. The cleaning apparatus as claimed in claim 13, wherein at least one of said water vapor and said water mist is accompanied by a gas.

15. The cleaning apparatus of claim 14 wherein the gas is one of air, nitrogen, carbon dioxide, ozone, argon, and helium.

16. The cleaning apparatus as claimed in claim 13 wherein the water vapor producing means is configured to produce the water vapor suitable for permeating the one of the resist film and the polymer residue, and the water mist producing means is configured to produce the water mist suitable for physically peeling the one of the resist film and the polymer residue.

17. The cleaning apparatus as claimed in claim 13, wherein the first temperature is different from the second temperature, the first temperature is at least equal to a boiling point of said water, and the second temperature is at most equal to the boiling point of the water.

18. The cleaning apparatus as claimed in claim 13 wherein the water mist producing means is configured to direct the water mist at the one of the resist film and the polymer residue after the water vapor producing means has directed the water vapor at the one of the resist film and the polymer residue.

* * * * *